US009543267B2

(12) United States Patent
Zaks et al.

(10) Patent No.: US 9,543,267 B2
(45) Date of Patent: Jan. 10, 2017

(54) ULTRA FINE PITCH WEDGE FOR THICKER WIRE

(71) Applicant: Micro Point Pro LTD., Yokneam Elite (IL)

(72) Inventors: Uri Zaks, Kiryat Motzkin (IL); Irina Voskoboynikov, Haifa (IL); Yefim Prosso, Haifa (IL); Irina Sastiel, Haifa (IL)

(73) Assignee: MICRO POINT PRO LTD., Yokneam, Elite (IL)

( * ) Notice: Subject to any disclaimer, the term of this patent is extended or adjusted under 35 U.S.C. 154(b) by 61 days.

(21) Appl. No.: 14/161,527

(22) Filed: Jan. 22, 2014

(65) Prior Publication Data
US 2014/0203065 A1 Jul. 24, 2014

Related U.S. Application Data

(60) Provisional application No. 61/755,464, filed on Jan. 22, 2013.

(51) Int. Cl.
*B23K 31/02* (2006.01)
*H01L 23/00* (2006.01)

(52) U.S. Cl.
CPC ............ *H01L 24/78* (2013.01); *H01L 24/45* (2013.01); *H01L 2224/45015* (2013.01);
(Continued)

(58) Field of Classification Search
CPC ............ H01L 2224/85205; H01L 2224/78313; H01L 24/85; B23K 20/004; B23K 20/005; B23K 20/10; B23K 2201/40
(Continued)

(56) References Cited

U.S. PATENT DOCUMENTS 1,924,384 A 8/1933 Stoody
4,030,657 A * 6/1977 Scheffer ............... B23K 20/005
228/1.1
(Continued)

FOREIGN PATENT DOCUMENTS

TW 201436920 A 10/2014
WO 2014/115142 A1 7/2014

OTHER PUBLICATIONS

International Search Report for PCT/IL2014/050077 dated May 21, 2014.
(Continued)

*Primary Examiner* — Erin Saad
(74) *Attorney, Agent, or Firm* — Nixon Peabody LLP; Joseph Bach, Esq.

(57) ABSTRACT

An ultra-fine pitch wedge bonding tool and method for its manufacture are disclosed. The wedge tool is formed with a foot width calculated to enable accurate bonding of wires separated at an ultra-fine pitch. The wedge tool is made out of a tungsten carbide alloy having characteristics conforming to specified constraints that lead to improved performance and enable the use of thicker wire. A pocket is formed at the tip of the wedge tool and a wire feeding hole is formed from the rear side of the tool and exiting inside the pocket, at an elevation above the bonding foot. Side walls are provided on both sides of the pocket to guide the wire exiting the feed hole inside the pocket towards the bonding foot.

17 Claims, 3 Drawing Sheets

(52) U.S. Cl.
CPC ............... *H01L 2224/45144* (2013.01); *H01L 2224/78315* (2013.01); *H01L 2224/78318* (2013.01); *H01L 2224/78319* (2013.01); *H01L 2924/00014* (2013.01); *H01L 2924/381* (2013.01); *Y10T 29/49995* (2015.01)

(58) Field of Classification Search
USPC ...................................... 228/180.5, 4.5, 904
See application file for complete search history.

(56) References Cited

U.S. PATENT DOCUMENTS

| | | | |
|---|---|---|---|
| 4,053,306 | A | 10/1977 | Rodriguez |
| 4,950,328 | A | 8/1990 | Odani et al. |
| 5,190,206 | A | 3/1993 | Miller et al. |
| 5,558,270 | A | 9/1996 | Nachon et al. |
| 6,135,341 | A | 10/2000 | Falcone |
| 6,676,005 | B2 | 1/2004 | Itoh et al. |
| 6,715,658 | B2 | 4/2004 | Perlberg et al. |
| 7,083,757 | B2 | 8/2006 | Billiet et al. |
| 2005/0279811 | A1 | 12/2005 | Bell |

OTHER PUBLICATIONS

International Preliminary Report on Patentability for PCT/IL2014/050077 dated Aug. 6, 2015.
Wire Bonding Wedges for Gold and Aluminium Wire, epak Electronics Ltd., 2013.
"Cemented Carbide, Sandvik new developments and applications," SANDVIK Hard Materials brochure, 16 pages, downloaded on Jan. 20, 2016, http://www2.sandvik.com/sandvik/0130/HI/SE03411.nsf/7a5364adb7735b05412568c70034ea1b/651f6e334db04c46c125707600562c88/$FILE/Cemented+Carbide.pdf.
"Selection of the most suitable carbide grade—Recommendation of applications," Hartmetall Estech AG brochure, 9 pages, downloaded on Jan. 20, 2016, http://www.hartmetall-estech.ch/files/2014/06/verkaufsbrosch%C3%BCre_hartmetall_sortenliste_anwendungen_englisch_oSM-low2.pdf.

* cited by examiner

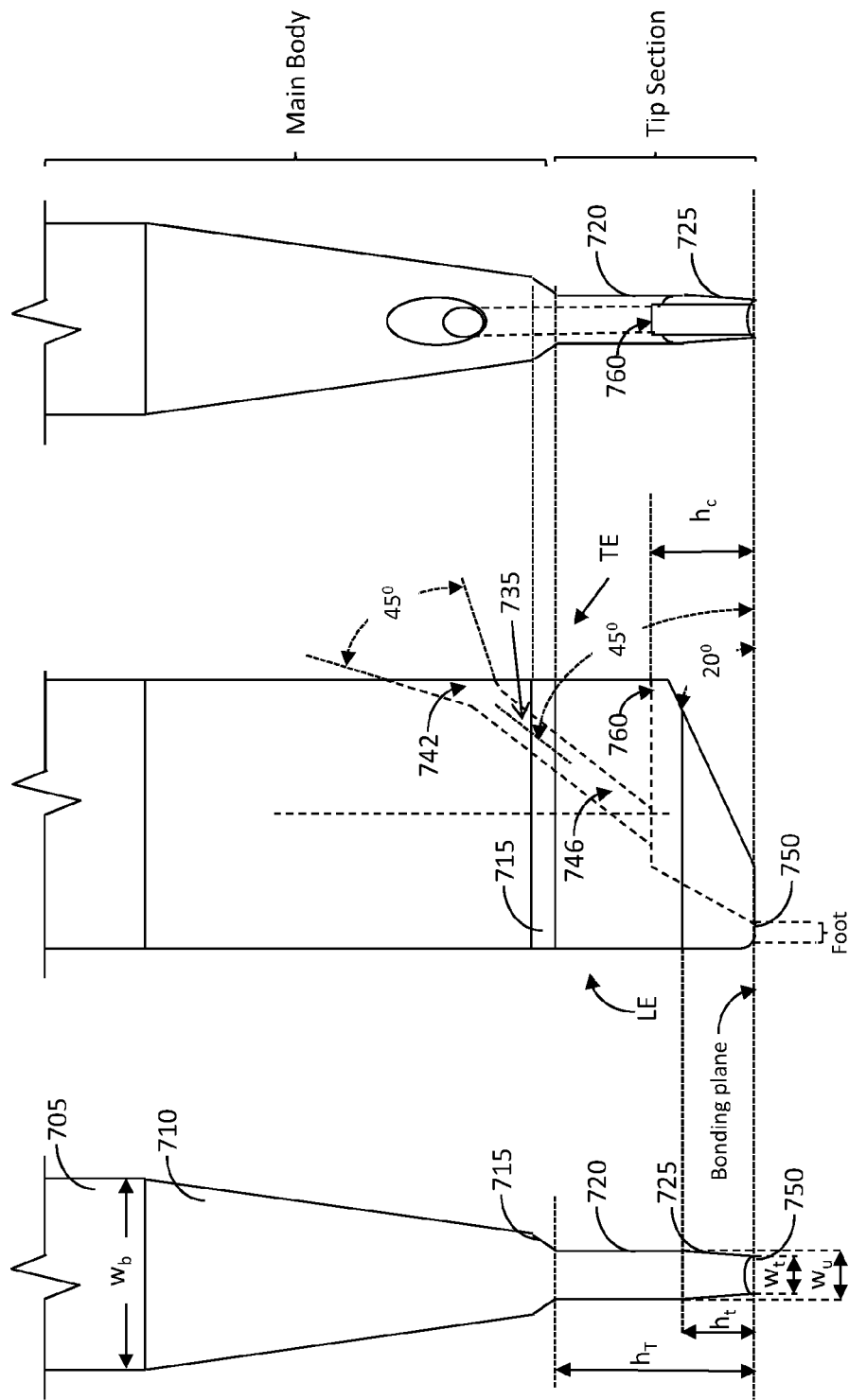

ULTRA FINE PITCH WEDGE FOR THICKER WIRE

RELATED APPLICATION

This application is a continuation of and claims priority from U.S. Provisional Application Ser. No. 61/755,464, filed on Jan. 22, 2013, the disclosure of which is incorporated herein by reference in its entirety.

BACKGROUND

1. Field

This invention relates to wedge tool for welding fine wires in the semiconductor chip industry. More particularly, the present invention relates to a wire bonding method and apparatus that enables welding wires to bonding pads positioned at an ultra-fine pitch.

2. Related Arts

Wire bonding is used in a semiconductor industry to electrically connect a chip to the circuit board. A plurality of bonding pads are located in a pattern on the top surface of the board, with the chip mounted in the center of the pattern of bonding pads. In standard chips, i.e., non-flip chip, the top surface of the chip facing away from the top surface of the substrate has a plurality of contact pads. Fine wires (which may be aluminum or gold wires) are connected between the contact pads on the top surface of the chip and the contact pads on the top surface of the board.

In general, two technologies have been developed for performing the welding of the fine wires: ball bonding and wedge bonding. In ball bonding, sometimes referred to also as capillary bonding, the connecting wires are supplied and bonded to the chip and to the substrate through a capillary tunnel traversing the entire length of the ball bonding tool. In this respect, the terms "bonding tool" "ball bonding tool" and "wedge bonding tool" refer to a tip which is installed on a bonder machine and which is used to feed and bond the wire to the pads. The ball bonding method has dominated the interconnect market because of its high speed and capabilities. However, as the need for much denser interconnects is increasing (the ITRS roadmap predicts that we are heading towards 20 μm pitch), ball bonding is reaching its limits. On the other hand, since wedge bonding can produce a smaller full strength weld than ball bonding, wedge bonding has the potential to dominate the market in ultra-fine-pitch devices.

Wire bonding is a welding process accomplished by deforming the wire and the substrate together, forming them into an alloy of the two constituents. Ultrasonic energy enhances the process by lowering the flow stress and allowing easy slip mechanisms for dislocation movement (deformation occurs by the movement of dislocations). Wedge bonding, because it directly deforms the wire without first forming a ball, is capable of producing a weld with less deformation than ball bonding. High quality welds can be produced with bond width that is only 20-25% larger than the wire diameter. This size is significantly smaller than the minimum size that a ball bonder can produce for the same wire diameter.

FIG. 1 shows the common bonding processes and compares their deformation as a function of initial wire diameter for an optimized process. Notably, the deformation caused by ball bonding requires much larger pitch than that is required by wedge bonding. Therefore, in order to achieve finer pitch capabilities, the wire diameter must be reduced—regardless of the type of bonder used. For ball bonders, reducing the wire diameter allows ball formation and subsequent deformation with a smaller final bond diameter. However, as wire diameter is decreased, conductivity and strength of the bond are also reduced. Many new devices require more current flow and the smaller diameter wire required by finer pitch devices has a negative impact on performance and reliability of the device. Wedge bonding has an advantage, because it can achieve equivalent pitch with a larger diameter wire, or finer pitch with the same diameter wire as ball bonding.

In order to develop a wedge bonder that would enable ultra-fine pitch bonding, two limitations need to be addressed. First, the ability to locate the wedge tip exactly on the desired location, including the ability to perform complicated processes. Second, the wedge tool dimensions must be reduced without affecting its strength, so as to allow working in narrow pitch and crowded wires environment.

Wedge bonder manufacturers have improved the bonders' capabilities, such that they are much faster than previous generation machines and now are capable of bonding speed of above 6 wires per second. New constant loop height and constant loop length algorithms achieve optimum control of electrical properties (impedance, capacitance). Low loop capability is superior because there is no ball adding to the bond height and the low take off angle of the wire naturally tends toward lower height. New looping motion algorithms provide the lowest loops achievable. In eight-die stacks, wedge bonds have been shown to achieve a 32% decrease in cross section and a 20% decrease in total stack height compared to standard ball bonded devices. This provides an inexpensive alternative to through silicon vias (TSVs) in 3-D packaging. Also, bond placement accuracy has improved. New machines are capable of 1 μm bond placement repeatability at 3σ.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments disclosed herein enable wire bonding for devices with ultra-fine pitch. In order to enable the ultra-fine pitch, embodiments of the invention provide a tip size with higher accuracy and gripping, which isn't available in the prior art. An oval hole is provided for the wire, having a special shape which complies with new clearance consideration. Since the thick wire is a design barrier on the wire exit, a special pocket is designed on the wedge's lower part. Also a new material is used so as to provide higher strength. Finally, an accurate wedge manufacturing process is used. This ultra-fine pitch wedge, in conjunction with bonder advances, have significantly improved bond placement thus enabling achieving the finest pitch available for any wire bonding process.

Embodiments disclosed herein also provide an ultra-fine pitch wedge bonding tool which, among others, incorporates a special design based on process calculation and utilizes hardened material.

Embodiments disclosed herein enable wire bonding on 35 μm pad pitch process, using 0.8 mil (20 μm) wire diameter. Since, thicker wire is utilized, it allows using higher current on the new generation devices. An equivalent pad pitch ball bonding capillary, for same process can be done only with 0.65 mil (16.5 μm) wire diameter.

According to aspects of the invention, a wedge bonding tool for bonding wire is disclosed, comprising: an elongated upper main body having a defined width $w_b$; a main body taper section reduces the width of the main body from $w_b$ towards a tip section positioned at the lower side of the main body and having a width $w_u$ smaller than $w_b$, wherein the tip section starts at a height $h_T$ above the foot section; a tip taper section reduces the width of the tip section from $w_u$ towards the foot section defining the bottom of the tip section and having a width $w_t$ smaller than $w_u$, wherein the tip taper section starts at a height $h_t$ above the foot section; a pocket is formed at bottom part of the tip section and extending upwards to a height of $h_c$, which is at least as high as the height $h_t$; a wire feeding hole traverses the main body at an acute angle with respect to the foot section, the wire feeding hole having a feeding opening at rear side of the main body and an exit opening at a ceiling side of the pocket at a height $h_t$ above the foot section. In one example the acute angle is 45°. In one example the wedge bonding tool further comprises two sidewalls, each positioned on one side of the pocket, and configured to guide wire exiting from the exit opening towards the foot section. In one example each of the sidewalls rises at an acute angle from the foot section towards and terminating at back side of the tip section.

According to other aspects, the feeding opening of the wire feeding hole is larger than the exit opening. The feeding opening may have an oval cross section. The exit opening may also have an oval cross section. In the above wedge tool, the height $h_c$ may be higher than height $h_t$.

According to further aspects, the wedge bonding tool is formed out of tungsten carbide alloy having grain size equal to or smaller than 0.5 μm. The density of the tungsten carbide may be maintained above 14.5 g/cm³. The hardness of the tungsten carbide may be maintained at higher than 90 HRa or 2,000 HV30. The transverse rupture strength of the tungsten carbide may be maintained at higher than 400 KPSI.

According to yet further embodiments, the wedge bonding tool has a foot section that is formed to have curvature corresponding to the wire on the bonding surface. This helps maintain the wire aligned to the bonding foot.

According to further aspects the wedge bonding tool has a wire feeding hole that comprises a conical section beginning with a large diameter at the feeding opening and narrowing as it progresses into the main body, and a cylindrical section between the exit opening and the conical section. The conical section and the cylindrical section may have oval cross section.

According to yet further aspects, a wedge bonding tool for bonding wire is provided, comprising a main body and tip section integrally formed of a tungsten carbide alloy having grain size of 0.5 μm or smaller, density above 14.5 g/cm³, hardness higher than 90 HRa or 2,000 HV30, and transverse rupture strength higher than 400 KPSI. The bottom part of the tip section forms a bonding foot, and wherein a pocket is formed behind the bonding foot and extending from bottom part of the tip section into interior of the tip section towards the main body, wherein the pocket is formed to have two sidewalls, each extending on one side of the tip behind the bonding foot. The wedge bonding tool further comprises a wire feeding hole extending from rear side of the main body to ceiling part of the pocket. The feeding hole may comprise a conical section having opening at the rear side of the main body and a tubular section having an opening at the ceiling part of the pocket and extending between the conical section and the ceiling part of the pocket.

According to further aspects, a method for fabricating a wedge bonding tool is disclosed, comprising: forming a rectangular slab out of a tungsten carbide alloy having grain size of 0.5 μm or smaller and density above 14.5 g/cm³; machining the rectangular slab to form a tapered section from a main body, a tip section extending from the tapered section, and a tip taper section at the bottom of the tip section; machining the tip taper section to form a bonding foot; and drilling a wire feeding hole leading from a first opening at rear side of the main body to a second opening at the tip section. The method may further comprise machining a pocket extending from the bonding foot to interior part of the tip section, such that the second opening lies at an upper part of the pocket at a height $h_c$ above the bonding foot.

The above features and aspects can be "mixed and matched" in any designed application to thereby obtain desired benefits. A specific embodiment may include all of the above features and aspects to gain maximum benefit, while other embodiments may implement only one or two of the features—depending on the particular situation or application of the embodiment.

Other aspects and features of the invention would be apparent from the detailed description, which is made with reference to the following drawings. It should be appreciated that the detailed description and the drawings provides various non-limiting examples of various embodiments of the invention, which is defined by the appended claims.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 2A is a table tabulating the various wire diameters usable with ball and wedge bonders for various pitch sizes, while

FIGS. 7A-7C are front, side and rear elevations of an ultra-fine pitch wedge according to one embodiment of the invention.

DETAILED DESCRIPTION

Figure 1:
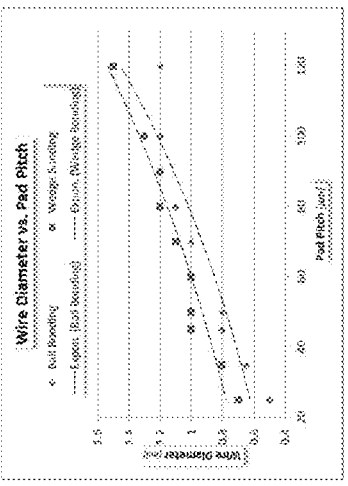
FIG. 1 is a plot of wire deformation for various wire bonding processes.
Figure 2A:
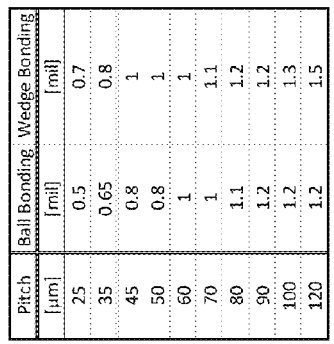
Figure 2B:
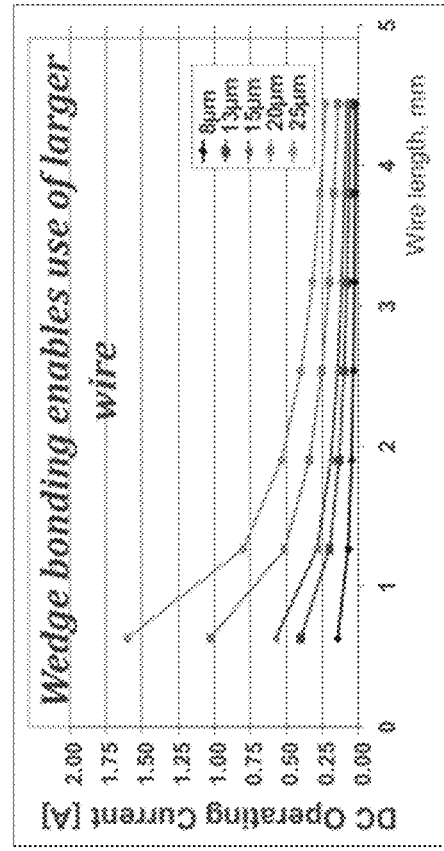
FIG. 2B is a plot for the usable wire diameter.

As the complexity of microchips increases, so is the need for the number of wires connecting to the chip. Increasing the number of wires per the same area of the chip causes reduction of the pad to pad pitch. The small distance between pads and wires led to the need of smaller bonding tools. However, manufacturing smaller bonding tools require drilling small wire feeding holes, in order to leave sufficient wall thickness. The final effect is that only very thin wire can be handled with small pitch tool. FIGS. 2A and 2B show the ability of using maximum wire diameter, for each bonding process, mostly on small pad pitch. From this table it is evident that the wedge tool has an advantage above the capillary, which is used on ball bonding process. The graph shows that for bonding to pads having the same pitch, wedge bonding has the ability to handle a thicker wire, thus providing less current resistance.

Considering bonding to pads having a given pitch, enabling the bonding of thicker wire also enables forming low loops on wire bonding, due to wire stiffness. Having low loops gives better advantages when there's a need to assemble flat devices, or when there's a need for smallest cross-section, i.e., total height of the assembled device. In a production example with a 10 stacked die application, the lower loops of a wedge bonder resulted in a 20% reduction in total package height. Wedge bonding can also bond very steep loops, close to the die edge resulting in a 32% decrease in package cross section, i.e., footprint. In one example a 12 µm wire wedge was bonded with a total height of 16 µm above the die edge. A feat no ball bonding could achieve.

The use of a thicker wire makes it also easy to handle by the operators. Therefore, it increases production and minimize machine down time.

Figure 3:
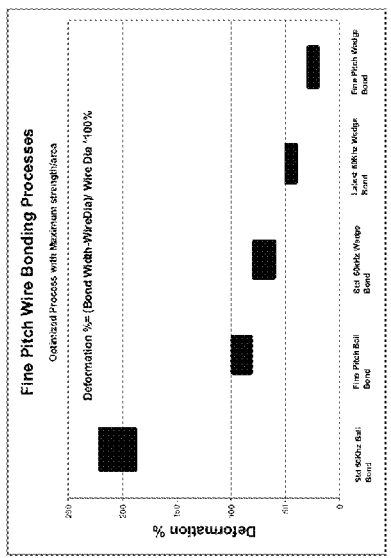
FIG. 3 is a plot of bond width for various bonding technologies.

FIG. 3 is a plot illustrating the resulting bond width for certain bonding technologies. In ball bonding, first a ball is produced and then the ball is deformed to a weld. On the other hand, wedge bonding deform the wire directly without forming the ball. Therefore wedge bonding can produce a bond that is 25% larger than the wire diameter (bond thickness=1.25*WD). Conversely, at minimum, a ball bonding produces a bond 80% larger than the wire diameter (bond diameter=1.8*WD). This data illustrates that wedge bonding enables using thicker wires for higher current and yet the contact area can be smaller than ball bonding.

Figure 4:
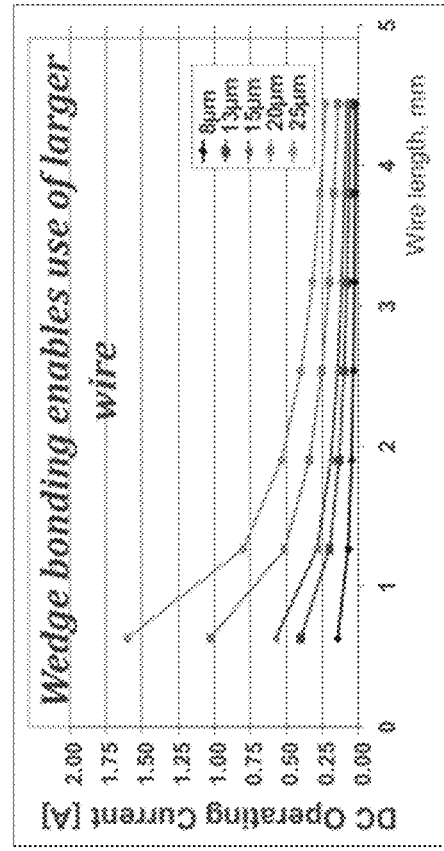
FIG. 4 is a plot illustrating the amount of DC current that can be used with various wires.

Smaller wire diameter is a requirement of finer pitch. But reducing wire diameter results in lower current carrying capacity. As we move towards 0.5-0.6 mil (13-15 µm) wire diameter we can safely carry less than 0.25 Amperes current. Today's chips require more current. Because a wedge bonding can produce a smaller bond size than in a ball bonding, it is capable of bonding the same pad pitch with larger diameter wire. FIG. 4 shows the benefit of greater current carrying capacity.

EXAMPLE I

Figure 5:
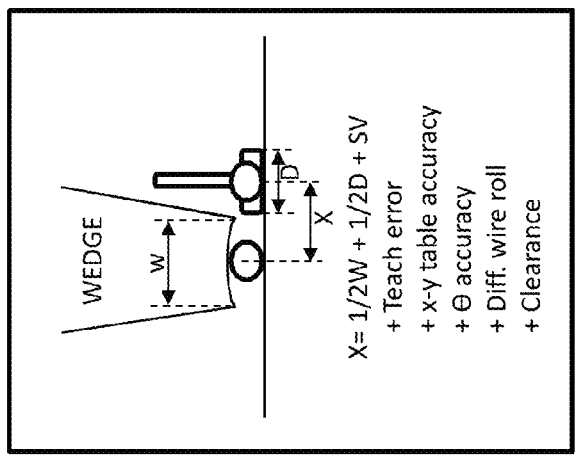
FIG. 5 is a diagram illustrating the calculations to design an ultra-fine pitch wedge according to embodiments of the invention.

A wedge tool was designed for ultra-fine wire pitch of 35 microns. With reference to FIG. 5, the following calculations are done in order to create a theoretical design, based on the application data. FIG. 5 illustrates the factors to be considered for final wedge width, W.

Variables:

$$WD(\text{Wire Diameter}) = 20 \ \mu m$$

$$d(\text{bond deformation}) = 22\%$$

$$SV(\text{Squash Variation}) = 1 \ \mu m$$

$$D(\text{Squash Width}) = WD \times \frac{(100+d)}{100}$$

$$D(\text{Squash Width}) = 20 \times \frac{(100+22)}{100}$$

$$D(\text{Squash Width}) = 24.4 \ \mu m$$

Source of Error:

$$T(\text{Teach Error}) = 1 \ \mu m$$

$$Ta(X\text{-}Y \text{ Table Accuracy}) = 0.5 \ \mu m$$

$$\Theta(\text{Theta Accuracy}) = 0 \ \mu m$$

$$Wr(\text{Wire Roll under the wedge}) = 0 \ \mu m$$

$$C(\text{Clearance}) = 0 \ \mu m$$

$$X(\text{Pad, Wire Pitch}) = 35 \ \mu m$$

$$X = \frac{(W+D)}{2} + Sv + T + Ta + \theta + Wr + C$$

$$\frac{(W+D)}{2} = X - (Sv + T + Ta + \theta + Wr + C)$$

$$W(\text{Wedge Width}) = 2 \times [X - (Sv + T + Ta + \theta + Wr + C)] - D$$

$$W(\text{Wedge Width}) = 2 \times [35 - (1 + 1 + 0.5 + 0 + 0 + 0)] - 24.4$$

$$W(\text{Wedge Width}) = 40.6 \ \mu m (1.6 \text{ mil})$$

Therefore, according to this example, the new 35 µm wedge tool includes the following features. The wedge has narrow front wedge width of 1.6 mil (40.6 µm) to keep the wedge walls from touching the adjacent wires and at the same time let enough wall thickness to ensure wider wire feed hole (to enable thicker wire). The sizes of the contact areas of the wedge with the pad are reduced. A foot length of 1.1 mil (28 µm) is proposed. This is the size for average pad size of 30-33 µm in that kind of fine pitch application. The wire feed hole is oval, so that it will suit 0.8 mil (20 µm) wire diameter, with nominal size of 1.35 mil (34.3 µm). The sizes of the oval holes are—
  a. Short diameter (HW) is 1.2 mil (30.5 µm); and,
  b. Long diameter (HL) is 1.5 mil (38 µm).

Figure 6B:
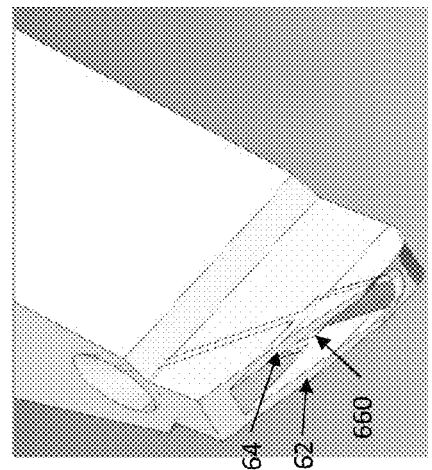
FIGS. 6A-6D are various elevations of an ultra-fine pitch wedge according to one embodiment of the invention.
Figure 6D:
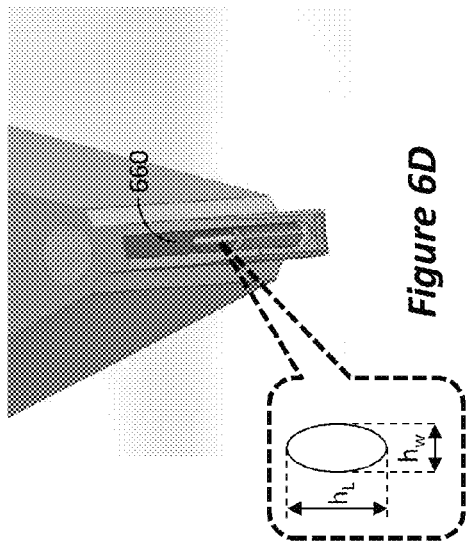

Notably, as illustrated in FIG. 6D, the shorter diameter is oriented perpendicular to the sidewall of the tip, such that the thickness of the sidewall can be maintained, while the long diameter is oriented in the direction from leading edge LE (FIG. 7B) to trailing edge TE (FIG. 7B). Consequently, the effective diameter is increased, while maintaining sufficiently thick sidewalls. That is, the long diameter enables free-play for the wire as it moves through the hole.

Higher manufacturing accuracy of the tip, hole and pocket on the center of the wedge's tall body would provide superior results. In one embodiment, the wedge is made out of WC (Tungsten Carbide) material with high strength and small grain size. To maintain wedge strength for bonding loads on a small wall thickness, it is beneficial to make the wedge out of a WC material having small grain size, high density, and high hardness. For maximum results, the grain size should be maintained at or smaller than 0.5 µm, the density above 14.5 g/cm$^3$, the hardness at higher than 90 HRa or 2,000 HV30, and the transverse rupture strength at higher than 400 KPSI. In one embodiment, a good WC wedge was made using WC material having the following properties:

Physical Properties:
  c. Grain Size: 0.5 µm-0.4 µm
  d. Density: 14.9 g/cm$^3$ e. Hardness: 94.5 HRa
f. Hardness: 2,050 HV30
g. Transverse Rupture Strength (TRS): 428 KPSI

EXAMPLE II

FIGS. 6A-6D illustrate various views of the tip of a wedge tool designed according to the above parameters and suitable for ultra-fine wire pitch, such as 35 microns. FIGS. 7A-7C are illustration of front (leading) edge, side, and rear (wire-feeding edge) views, respectively, of the designed wedge tool according to this example. The design of this example is configured to conform to two opposing requirements, namely, be very thin so as to enable placing between wires bonded at ultra-fine pitch and at the same time have wide hole enabling the threading of a large diameter wire—without the hole weakening the tip of the wedge tool. As illustrated in FIGS. 7A-7C, much of the upper part of the wedge tool is an elongated block the design of which is not relevant to the design or operation of the tool, it is therefore illustrated as truncated and is referred to herein as main body. The lower part of the wedge tool undergoes tapering by several tapered sections, culminating in a foot having the designed width W.

As shown in FIGS. 7A-7C, main body tapered section 710 leads to intermediate or tip section 720 via transition section 715. In this example, transition section 715 has a steeper taper than the taper of main body taper section 710. The intermediate section starts at a height of $h_T$ from the bottom of the foot 750. A bottom or tip taper section 725 starts at a height of $h_t$ above foot 750 and culminates at the bottom of foot $h_t$. The bottom/tip taper is formed such that at the bottom of the foot the taper width is W, i.e., the width required for the ultra-fine pitch wire bonding.

As illustrated in Example I above, for ultra-fine pitch bonding, the width W may be as narrow as 40.6 µm. However, if the wedge tool is to be used with relatively thick wires, the feeding hole for the wire needs to be of sufficiently large diameter. In Example I, the diameter may be 38 µm. Drilling such a wide hole into such a thin foot of the wedge would drastically weaken the sidewall of the wedge, such that it may easily break. To avoid such a failure, the following feature is introduced. Namely, the bottom of the wedge includes a pocket or cavity 660 (see FIG. 6 and shown in broken line in FIG. 7B) that extends up to a height $h_u$ (see FIG. 7B), which is at least as high as height $h_t$, but for better results should be higher than $h_t$. Due to the bottom or tip taper section 725, at the top of height $h_c$ the width of the wedge is $W_u$, which is wider than $W_t$ (See FIG. 7A). The wire feeding channel extends only up to and is opened at the roof or ceiling of cavity/pocket 660, such that the hole does not extend to the tip of the wedge which has narrow width $W_t$. That is, the entire length of the wire feeding hole traverses areas where the width of the wedge is larger than $W_t$. This ensures that the relatively large diameter wire feeding hole does not weaken the bonding foot 750.

Figure 6A:
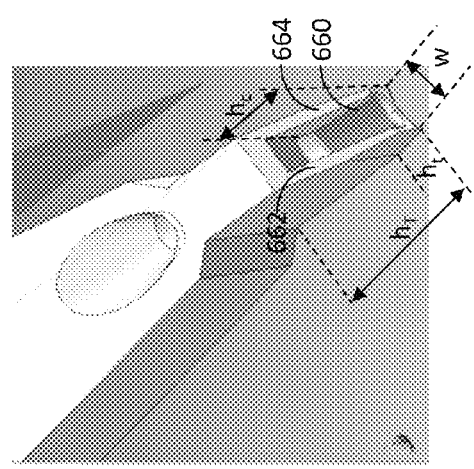
Figure 6C:
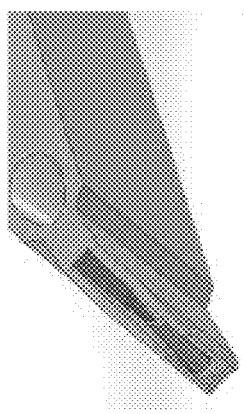

Moreover, the pocket 660 is made such that it is flanked by two sidewalls 662 and 664 (see FIGS. 6A and 6B). The two sidewalls 662 and 664 guide the wire as it exits the wire feeding hole so that it is aligned to be pressed by the wedge foot 750. That is, since the wire guiding hole 735 terminates above the foot 735, it may roll or bend before reaching the foot position to be pressed into a weld, so that the alignment of the weld may not be accurate. To avoid that, two guiding sidewalls 662 and 664 are provided to flank the two sides of the wire and guide it into alignment under the bonding foot 750.

Also, in the illustrated embodiments the feeding hole is formed of two sections: a conical or funnel section 742 and a tubular or cylindrical section 746. The conical section 742 has a large opening at the rear part of the main body and forms a wire feeding inlet. In the illustrated embodiments, the conical section 742 has an oval cross-section (see FIG. 6A). Also, in the illustrated example the sidewalls of the conical section flare at an acute angle, here 45° (see FIG. 7B). The smaller opening of the conical section 742 lead to the tubular section 746, which has an exit opening at the ceiling part of pocket 660 and also has an oval shape (see callout in FIG. 6D). The oval shape of the tubular section 746 enables a relatively thick wire to pass through the hole, as it has some free-play in the long-diameter direction of the tubular section. Conversely, the short diameter enables maintaining sufficient sidewall thickness to ensure proper strength of the tip.

The resulting wedge bonding tool comprises a main body, a tapered section, and a tip section, integrally formed of a tungsten carbide material having small grain side, high density, and high hardness. The wedge bonding tool has a leading edge, a trailing edge, and a bonding foot defining a bonding plane. When viewed from the leading edge side, the bonding foot has an arch from one side of the tip section to the other side of the tip section. When viewed from the leading edge, the main body has a defined width $W_b$, the tapered section reduces the width, such that the width of the tip section is Wu, which is much smaller than $W_b$, and a tip taper section further reduces the width such that the width at the bonding foot is $W_t$, which is sufficiently thin to enable bonding at ultra-fine pitch without touching adjacent wires.

When viewed from the bottom, a pocket is formed behind the foot and extending all the way to the trailing edge. The pocket also extends into the tip section, beyond the location where the tip taper section begins, i.e., the pocket extends into the tip section to at least where the width of the tip section is $W_u$, at which point the pocket defines a ceiling. Also, when viewed from the bottom a retaining wall is formed on each side of the pocket, extending from the bonding foot to the trailing edge. When viewed from the side, each of the retaining walls has a bottom that is at an acute angle with respect to the bonding plane. In one example the acute angle is 20°. Consequently, at the trailing edge the retaining walls terminate at a distance above the bonding surface.

A wire feeding hole is drilled from the trailing edge towards the ceiling of the pocket. The wire feeding hole is drilled at an acute angle with respect to the bonding plane. In one example the acute angle is 45°. Since the wire feeding hole terminates at the ceiling of the pocket, and since the ceiling of the pocket is at a location where the tip has width that is wider than the width at the bonding foot, the size of the hole may be increased without weakening the bonding foot. In one example the wire feeding hole is formed of two sections: a conical section and a tubular section. The conical section has its base an as oval opening at the trailing edge surface and its smaller opening inside the tip section if fluid communication with the tubular section. The tubular section terminates with an oval opening at the ceiling of the pocket. In one example the major diameter of the oval opening of the tubular section is 38 microns while the minor axis is 30.5 microns.

EXAMPLE III

A method for fabricating an ultra-fine pitch wedge tool has been developed. The method starts by obtaining a substantially rectangular slab of a tungsten carbide alloy having grain size of 0.5 µm or smaller, density above 14.5 g/cm³, hardness higher than 90 HRa or 2,000 HV30, and transverse rupture strength higher than 400 KPSI. The slab is machined to form a main body part, a tapered part reducing the width of the main body part towards a tip part, and a tip part extending from the tapered part and terminating at the bottom of the tool to form a bonding foot. The tip part is further machined to have a tip tapered part, so as to reduce the width of the tip such that the foot has the smallest width, $W_f$, of the wedge tool. The width $W_t$ is calculated to enable bonding wires at ultra-fine pitch, i.e., pitch of 35 µm or less.

In order to enable the use of a thick wire, a pocket 660 is formed at the bottom of the tip, behind the bonding foot. The pocket extends from the bottom of the wedge tool towards the interior of the tip, terminating at a ceiling 760 at height $h_u$ above the bonding foot. At height $H_c$ above the foot the width of the tip is larger than the width at the foot, such that drilling a relatively large diameter hole does not weaken the wedge tool. That is, the height of the ceiling is within the tip part, above the location where the tip tapered part begins. The wire feeding hole is drilled from the rear side of the main body at an acute angle with respect to the foot, and exiting at the ceiling of the pocket, where the width of the tip is wider than the width at the foot. In one example, the feeding hole is drilled at a 45° angle with respect to the bonding plane of the bonding foot. The bonding surface of the bonding foot is machined to have an arch corresponding to and aligned with the wire to be bonded. This arch also helps keeping the wire at the center of the bonding foot. Also, the pocket is machines such that two sidewalls 662 and 664 are provided, each on one side of the pocket, in order to maintain and guide the wire as it exits the exit opening of the wire feeding hole. The two sidewalls guide the wire towards the bonding foot.

EXAMPLE IV

Wedge bonding tool was fabricated according to the above embodiments and tested at an application laboratory. The test sequence included three sets of tests. A first run was done bonding with 40 µm pad pitch process, and it passed successfully. Then a second test run was performed using the same wedge bonding tool and same wire, but reducing the pad pitch to 38 µm. It passed successfully as well. A final run was performed on 35 µm pad pitch and passed successfully with no touching among the wires. Also, the bonded wires were straight and stable. While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A wedge bonding tool for bonding wire, comprising:
an elongated upper main body having a defined width $w_b$;
a main body taper section having a leading outer surface of the tool and a trailing outer surface of the tool opposite and parallel to the leading outer surface and two outer side surfaces located between the lead and trailing outer surfaces reducing the width of the main body from $w_b$ towards a tip section positioned at the lower part of the main body, the tip section having a constant width $w_u$ smaller than $w_b$, wherein the tip section starts at a height $h_T$ above a foot section, the foot section extending from the leading outer surface;
a tip taper section reducing the width of the tip section from $w_u$ towards the foot section defining the bottom of the tip section and having a width $w_t$ smaller than $w_u$, wherein the tip taper section starts at a height $h_t$ above the foot section, wherein $h_t$ is lower than $h_T$;
a pocket formed at the bottom part of the tip section and extending upwards to a ceiling part at a height of $h_c$, which is at least as high as the height $h_t$ such that the pocket extends into the tip section where the width is constant $W_u$ and the ceiling part is within the tip section having constant width $w_u$, the pocket being formed behind the foot section and extending up to and terminating at the trailing outer surface;
a wire feeding hole traversing the main body at an acute angle with respect to the foot section, the wire feeding hole having a feeding opening at the trailing outer surface of the main body taper section and an exit opening at the ceiling part of the pocket at a height $h_c$, above the foot section, and having an oval shape; and,
two sidewalls extending down from the two outer sides surfaces, each positioned on one side of the pocket such that the pocket is flanked by the two sidewalls that are extending downwards from the ceiling part towards the foot so as to guide wire exiting from the exit opening towards the foot section by flanking the wire by the two sidewalls as it exits the exit opening and guide the wire into alignment under the foot so that the wire is aligned to be pressed by the foot, each of the sidewalls is rises at an acute angle from the foot section towards and terminating at trailing outer surface of the main body taper section.

2. The wedge bonding tool of claim 1, wherein the acute angle is 45°.

3. The wedge bonding tool of claim 1, wherein the feeding opening is larger than the exit opening.

4. The wedge bonding tool of claim 3, wherein the feeding opening has an oval cross section.

5. The wedge bonding tool of claim 4, wherein the exit opening has its long diameter of the oval cross section oriented in a direction from the leading edge to the trailing edge.

6. The wedge bonding tool of claim 1, wherein height $h_c$ is higher than height $h_t$.

7. The wedge bonding tool of claim 1, formed out of tungsten carbide having grain size equal or smaller than 0.5 µm.

8. The wedge bonding tool of claim 7, wherein the density of the tungsten carbide is maintained at or above 14.5 g/cm3.

9. The wedge bonding tool of claim 8, wherein the hardness of the tungsten carbide is maintained at higher than 90 HRa or 2,000 HV30.

10. The wedge bonding tool of claim 9, wherein the transverse rupture strength of the tungsten carbide is maintained at higher than 400 KPSI.

11. The wedge bonding tool of claim 1, wherein the foot section is formed to have curvature corresponding to the wire.

12. The wedge bonding tool of claim 1, wherein the wire feeding hole comprises a conical section beginning with a large diameter at the feeding opening and narrowing as it progresses into the main body, and a cylindrical section between the exit opening and the conical section.

13. The wedge bonding tool of claim 12, wherein the conical section and the cylindrical section have oval cross section.

14. The wedge bonding tool of claim 1 for bonding wire, wherein the main body and the tip section are integrally formed of a tungsten carbide alloy having grain size of 0.5 μm or smaller, density above 14.5 g/cm$^3$, hardness higher than 90 HRa or 2,000 HV30, and transverse rupture strength higher than 400 KPSI.

15. The wedge bonding tool of claim 14, wherein the foot section is formed to have curvature corresponding to the wire.

16. The wedge bonding tool of claim 15, wherein height $h_c$ is higher than height $h_t$.

17. The wedge bonding tool of claim 16, wherein the feeding hole comprises a conical section having opening at the rear side of the main body and a tubular section having an opening at the ceiling part of the pocket and extending between the conical section and the ceiling part of the pocket.

* * * * *